United States Patent
Zhang et al.

(10) Patent No.: US 8,229,719 B2
(45) Date of Patent: *Jul. 24, 2012

(54) FINITE ELEMENT ALGORITHM FOR SOLVING A FOURTH ORDER NONLINEAR LUBRICATION EQUATION FOR DROPLET EVAPORATION

(75) Inventors: Jie Zhang, Santa Clara, CA (US); Jiun-Der Yu, Sunnyvale, CA (US)

(73) Assignee: Seiko Epson Corporation, Tokyo (JP)

( * ) Notice: Subject to any disclaimer, the term of this patent is extended or adjusted under 35 U.S.C. 154(b) by 777 days.

This patent is subject to a terminal disclaimer.

(21) Appl. No.: 12/411,810

(22) Filed: Mar. 26, 2009

(65) Prior Publication Data

US 2010/0250203 A1    Sep. 30, 2010

(51) Int. Cl.
*G06F 17/10* (2006.01)
*G06F 7/60* (2006.01)

(52) U.S. Cl. .................................. 703/9; 703/2
(58) Field of Classification Search ............ 703/9, 2
See application file for complete search history.

(56) References Cited

U.S. PATENT DOCUMENTS

| | | | |
|---|---|---|---|
| 6,391,986 B1 | 5/2002 | Goode et al. | |
| 6,471,761 B2 | 10/2002 | Fan et al. | |
| 6,660,209 B2 | 12/2003 | Leyden et al. | |
| 6,754,551 B1 | 6/2004 | Zohar et al. | |
| 6,913,832 B2 | 7/2005 | Fan et al. | |
| 7,022,534 B2 | 4/2006 | Gupta et al. | |
| 7,085,695 B2 | 8/2006 | Yu et al. | |
| 7,117,138 B2 * | 10/2006 | Yu et al. ............... | 703/9 |
| 7,147,306 B2 | 12/2006 | Silverbrook et al. | |
| 7,160,633 B2 | 1/2007 | Tai et al. | |
| 7,169,989 B2 | 1/2007 | Marks et al. | |
| 7,176,040 B2 | 2/2007 | Sirringhaus et al. | |
| 8,014,986 B2 * | 9/2011 | Zhang et al. ........... | 703/9 |
| 2005/0052120 A1 | 3/2005 | Gupta et al. | |
| 2007/0043544 A1 | 2/2007 | Song et al. | |
| 2007/0136042 A1 | 6/2007 | Yu | |
| 2007/0239414 A1 | 10/2007 | Song et al. | |
| 2007/0250296 A1 | 10/2007 | Shima et al. | |

FOREIGN PATENT DOCUMENTS

| | | |
|---|---|---|
| EP | 0 765 236 B1 | 7/1999 |
| EP | 1 208 985 A2 | 5/2002 |
| JP | 10-256330 | 9/1998 |

OTHER PUBLICATIONS

John W. Barrett, James F. Blowey, Harold Garcke, "Finite Element Approximation of a Fourth Order Nonlinear Degenerate Parabolic Equation" Nov. 2007, pp. 1-28.*

Guena, G., et al., "Evaporation of sessile liquid droplets", Elsevier, Colloids and Surfaces A: Physicochem Eng. Aspects 291, 2006, pp. 191-196.

(Continued)

*Primary Examiner* — Dwin M Craig

(57) ABSTRACT

The present invention is directed towards systems, methods and a computer-readable medium for simulating the evolution of a height of an evaporating droplet. The simulation includes a simulation space with boundary conditions. The simulation includes generating a height function that is representative of the height of the droplet at a first point in time at a plurality of points in the simulation space based upon a lubrication equation that is a differential function describing variation of the height function over time. The simulation determines the height function at a second point in time by finding an approximate solution that satisfies the lubrication equations and boundary conditions.

15 Claims, 5 Drawing Sheets

OTHER PUBLICATIONS

Hu, H., et al., "Evaporation of a Sessile Droplet on a Substrate", J. Phys. Chem. B, 2002, 106, pp. 1334-1344.

Schunk, P.R., et al., "Finite element modeling of evaporation and condensation during sol-gel film and fiber formation", VIII International Conference on Finite Elements in Fluids, Barcelona, Spain Sep. 20-24, 1993.

de Gans, Berend-Jan, et al., "Inkjet Printing of Polymers: State of the Art and Future Developments", Advanced Materials, 2004, 16, No. 3, Feb. 3.

Chernyak, V., "The Kinetic Theory of Droplet Evaporation", J. Aerosol Sci., vol. 26, No. 6, pp. 873-885, 1995.

Widjaja, E., et al., "Numerical study of vapor phase-diffusion driven sessile drop evaporation", Elsevier, Computers & Chemical Engineering 32, 2008, pp. 2169-2178.

Bayada, G., et al., "On a free boundary problem for the Reynolds equation derived from the Stokes system with Tresca boundary conditions" Journal of Mathematical Analysis and Applications, J. Math. Anal. Appl. 282, 2003, pp. 212-231.

Deegan, R., "Pattern formation in drying drops", Physical Review E, vol. 61, No. 1, Jan. 2000, pp. 475-485.

Percin, G., et al., "Piezoelectric droplet ejector for ink-jet printing of fluids and solid particles", Review of Scientific Instruments, vol. 74, No. 2, Feb. 2003, pp. 1120-1127.

Tarasevich, Y., "Simple analytical model of capillary flow in an evaporating sessile drop", Physical Review E 71, 027301, 2005.

Decent, S.P., "The spreading of a viscous microdrop on a solid surface", Microfluid Nanofluid, 2006, 2: 537-549.

Schwartz, L.W., "Theoretical and Numerical Modeling of Coating Flow on Simple and Complex Substrates including Rheology, Drying and Marangoni Effects", Advances in Coating and Drying of Thin Films, 1999.

Chen, C, et al., "Uniform Solute Deposition of Evaporable Droplet in Nanoliter Wells", Journal of Microelectromechanical Systems, vol. 16, No. 5, Oct. 2007, pp. 1209-1218.

Ozawa, K, et al., "Modeling of the Drying Process of Liquid Droplet to Form Thin Film", Japanese Journal of Applied Physics, vol. 44, No. 6A, 2005, pp. 4229-4234.

Fischer, B., "Particle Convection in an Evaporating Colloidal Droplet", Langmuir 2002, 18, pp. 60-67.

Bonn, D., et al., Wetting and Spreading, Review of Modern Physics, vol. 81, Apr.-Jun. 2009, pp. 739-805.

Tseng, F.G., et al., "A High-Resolution High-Frequency Monolithic Top-Shooting Microinjector Free of Satellite Drops-Part I: Concept, Design, and Model", Journal of Microelectromechanical Systems, vol. 11, No. 5, Oct. 2002, pp. 427-436.

Pasandideh-Fard, M., et al., "A three-dimensional model of droplet impact and solidification", International Journal of Heat and Mass Transfer 45, 2002, pp. 2229-2242.

Hu, H., et al., "Analysis of the Microfluid Flow in an Evaporating Sessile Droplet", Langmuir 2005, 21, pp. 3963-3971.

Hu, H., et al., "Analysis of the Effects of Marangoni Stresses on the Microflow in an Evaporating Sessile Droplet", Langmuir 2005, 21, pp. 3972-3980.

Deegan, R., et al., "Capillary flow as the cause of ring stains from dried liquid drops", Nature, vol. 389, Oct. 1997, pp. 827-829.

Deegan, R., et al., "Capillary flow as the cause of ring stains from dried liquid drops", James Franck Institute, Chicago, IL., Jul. 15, 1997, pp. 1-4.

Popov, Y.O., et al., "Characteristic Angles in the Wetting of an Angular Region: Deposit Growth", Department of Physics, University of Chicago, Jun. 6, 2003, pp. 1-36.

Deegan, R., et al., "Contact line deposits in an evaporating drop", Physical Review E., vol. 62, No. 1, Jul. 2000, pp. 756-765.

Sultan, E., et al., "Diffusion-limited evaporation of thin polar liquid films", Journal of Engineering Mathematics 50: 2004, pp. 209-222.

Widjaja, E., et al., "Dynamics of sessile droplet evaporation: A comparison of the spine and the elliptic mesh generation methods", Elsevier, Computers & Chemical Engineering 31, 2007, pp. 219-232.

* cited by examiner

FINITE ELEMENT ALGORITHM FOR SOLVING A FOURTH ORDER NONLINEAR LUBRICATION EQUATION FOR DROPLET EVAPORATION

BACKGROUND

1. Field of Invention

The present application is directed towards systems and method for simulating the evaporation of a droplet.

2. Description of Related Art

The industrial printing process includes the production of small ink droplets. Each ink droplet may contain a plurality of solvents and solutes. The solute is a metal, polymer, other materials, or mixtures of materials. The solute may be a functional or ornamental material. Each ink droplet may be ejected onto a target area of a patterned substrate. After the droplets lands, the solvent evaporates and a thin film of the solute is formed. Controlling the final pattern of the solute film is essential to assuring the quality and repeatability of the printing process. In order to control the final pattern of the solute film, it is crucial to understand how the final pattern is formed. Understanding the influence of factors such as the evaporation rate, the initial droplet volume, the shape, the initial solute concentration and the contact line dynamics are crucial in controlling the final pattern. Numerical simulations of the printing process are useful tools for understanding the influence of these factors and for developing the control process for printing.

In the later stage of the ink drying process the aspect ratio of the droplet (the length of the droplet vs. the height of the droplet) increases and becomes quite large. Lubrication theory, which is good for describing the physics of thin films, may be applied to describe the evaporation physics and greatly reduce the complexity of the simulation at the later stage of the ink drying process. Lubrication theory is an approximation of the Navier-Stokes equation for thin films. The application of lubrication theory results in a fourth-order interface evolution equation. The fourth-order interface evolution equation describes the evolution of droplet surface considering the effects of evaporation rate, surface tension, and fluid viscosity. Prior art methods have solved these equations on a flat geometry and assumed that the droplet would take the form of a spherical cap. This assumption is invalid when the surface is not flat.

The present invention is a system and method for simulating the evaporation of a droplet on a non-flat surface using lubrication theory.

SUMMARY OF INVENTION

The present invention is a system or method that may include a computer-readable medium encoded with instructions for a processor to perform a method for simulating the evolution of a height of an evaporating droplet.

An embodiment of the present invention may include generating a simulation space. The simulation space may be described in terms of three orthogonal axes, a x-axis, a y-axis, and a z-axis. The simulation space may be bounded by a xz-plane defined by the x-axis and the z-axis. The simulation space may also bounded by a yz-plane defined by the y-axis and the z-axis.

An embodiment of the present invention may include generating a height function that is representative of the height of the droplet at a first point in time at a plurality of points in the simulation space based upon a lubrication equation that is a differential function describing variation of the height function over time An embodiment of the present invention may include determining the height function at a second point in time by finding an approximate solution that satisfies the lubrication equations and boundary conditions. The boundary conditions along the xz-plane may include equating to zero a function of a partial derivate along the y-axis of a Laplacian of the height function. The boundary conditions along the xz-plane may further include equating to zero the partial derivative of the height function along the y-axis. The boundary conditions along the yz-plane includes equating to zero a function of a partial derivate along the x-axis of a Laplacian of the height function. The boundary conditions along the yz-plane may further include equating to zero the partial derivate of the height function along the x-axis.

In an embodiment of the present invention the lubrication equation may include a first differential function that describes a proportional relationship between an intermediate variable and a Laplacian of the height function. The lubrication equation may also include a second differential function. The second differential function may include a first term that is a partial derivative of the height function with respect to time. The second differential function may also include a second term that is proportional to the evaporation rate of the droplet. The second differential function may include a third term that is a third function of the height function, and the intermediate variable.

In an embodiment of the present invention the third function may be a divergence of a fourth function of the height and the intermediate variable. In an embodiment of the present invention the fourth function is proportional to the cube of the height function. In an embodiment of the present invention the fourth function is proportional to the gradient of the intermediate variable.

In an embodiment of the present invention the approximate solution is found using the finite element method. In an embodiment of the present invention the evaporation rate of the droplet is a function of space and time. In an embodiment of the present invention the first differential function is described by the equation, $P(\vec{\xi},t)=\nabla^2 h(\vec{\xi},t)$, wherein P is the intermediate variable, h is the height function. In an embodiment of the present invention the second differential function is described by the equation, $$\frac{\partial h(\vec{\xi},t)}{\partial t} + \nabla \cdot \left( \frac{h(\vec{\xi},t)^3}{3Ca} \nabla P(\vec{\xi},t) \right) = -EJ(\vec{\xi},t),$$

wherein P is the intermediate variable, h is the height function, $\vec{\xi}$ is a position vector, Ca is the Capillary Number, E is the dimensionless evaporation parameter, and J is the evaporation rate.

In an embodiment of the present invention a system including a processor may perform instructions for performing a method for simulating the evaporation of a droplet.

In an embodiment of the present invention the first differential function is solved implicitly, the second term of the second differential function is solved explicitly, and the height portion of the third function is solved explicitly.

In an embodiment of the present invention a method of manufacturing may include evaporating droplets on a substrate and the manufacturing method is adjusted based on the results of simulation of the evaporation of a droplet.

An alternative embodiment of the present invention may include a computer-readable medium encoded with instructions for a processor to perform a method for simulating the evolution of a height of an evaporating droplet. The alternative embodiment of the present invention may include generating a simulation space.

The alternative embodiment of the present invention may include generating a height function that is representative of the height of the droplet at a first point in time at a plurality of points in the simulation space based upon a lubrication equation that is a differential function describing variation of the height function over time.

The alternative embodiment of the present invention may include determining the height function at a second point in time by finding an approximate solution that satisfies the lubrication equations and boundary conditions that includes a contact line.

The alternative embodiment of the present invention may include method of manufacturing that includes evaporating droplets on a substrate, wherein the manufacturing method is adjusted based on the results of operation of the method of claim 13 encoded on the computer readable medium.

In an alternative embodiment of the present invention may the boundary conditions include equating to zero a first function that includes a dot product of a vector normal to the contact line with a second function, in which the second function is a gradient of a Laplacian of the height function.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings wherein like reference symbols refer to like parts.

DESCRIPTION OF THE PREFERRED EMBODIMENTS

An embodiment of the present invention may be a system and method for constructing a finite element (FEM) type method for solving a fourth-order interface evolution equation obtained from a lubrication theory based description of an evaporating droplet on a non-flat substrate.

Mathematical Modeling and Governing Equations

An embodiment of the present invention may be used to study the evaporation of a droplet on an OLED (organic light emitting diode) bank structure In an embodiment of the present invention, a contact line between the droplet and a substrate may be fixed. This is a reasonable assumption at the later stages of the evaporation of the droplet.

In an embodiment of the present invention, the droplet is assumed to have two symmetry planes (x=0 and y=0). These two planes intersect at an origin located at the center of the droplet. An evolution equation for the droplet interface may also be written in cylindrical coordinates (r, θ, z) as in equation (1).

$$\frac{\partial h}{\partial t} + \frac{1}{r}\frac{\partial}{\partial r}\left[r\frac{h^3}{3Ca}\frac{\partial P}{\partial r}\right] + \frac{1}{r^2}\frac{\partial}{\partial \theta}\left[\frac{h^3}{3Ca}\frac{\partial P}{\partial \theta}\right] = -EJ(r, \theta, t) \quad (1)$$

Equation (1) is written terms of the height of the droplet h above the plane 104, the evaporation rate J and a dimensionless evaporation parameter E, the polar coordinates (r, θ), time t, and an intermediate variable P which is defined in equation (2). The intermediate variable P is written solely in terms of the height of the droplet above the plane 104 and the spatial coordinates.

$$P = \left[\frac{1}{r}\frac{\partial}{\partial r}\left(r\frac{\partial h}{\partial r}\right) + \frac{1}{r^2}\frac{\partial^2 h}{\partial \theta^2}\right] \quad (2)$$

Figure 1:
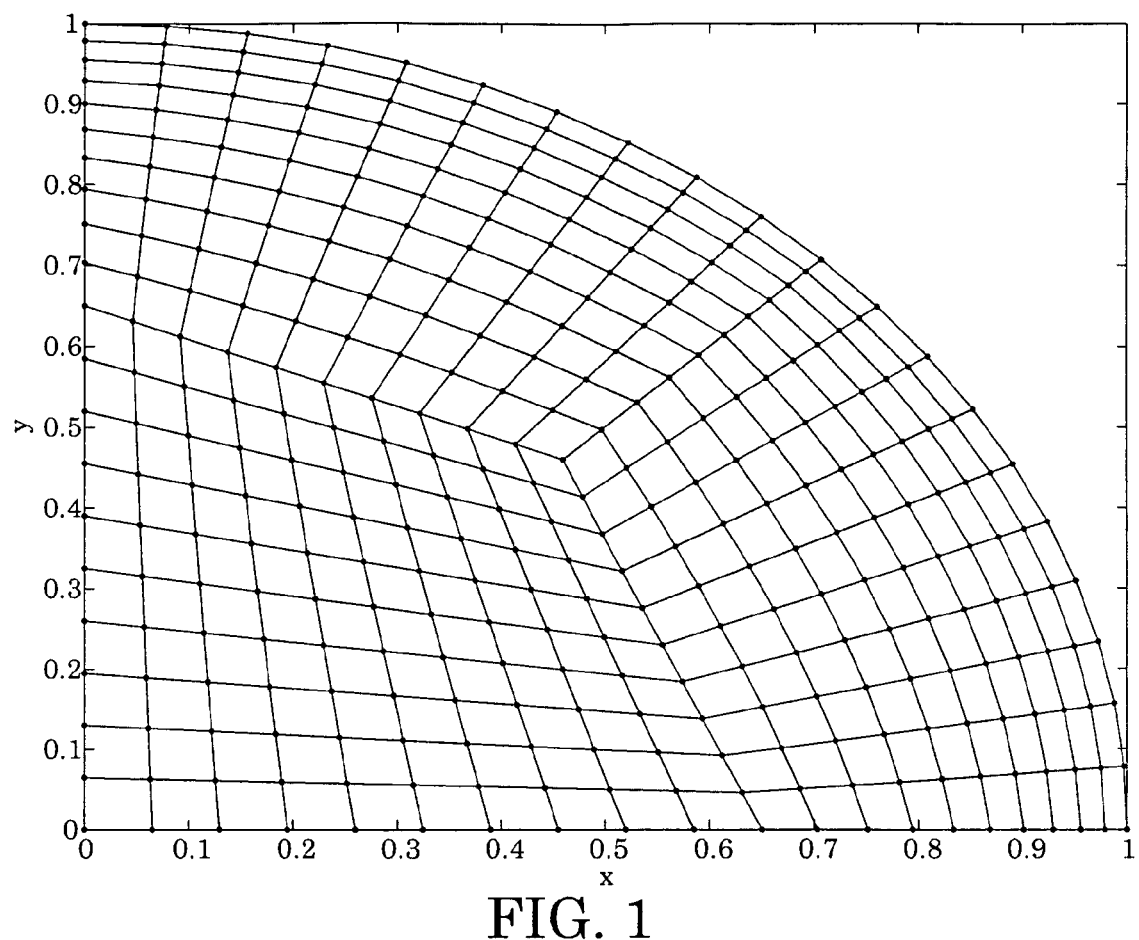
FIG. 1 is an illustration of a mesh that may be used in a Cartesian coordinate system to describe a quarter of the droplet.

The evolution equation may also be written in terms of the Cartesian coordinate system as in equations (3) and (4). The symmetry planes may be used to simplify the problem by reducing the size of the simulation space to one quarter of the full space that the droplet occupies. FIG. 1 is an illustration of a mesh that may be used in a Cartesian coordinate system to describe a quarter of the droplet.

$$\frac{\partial h}{\partial t} + \frac{\partial}{\partial x}\left[\frac{h^3}{3Ca}\frac{\partial P}{\partial x}\right] + \frac{\partial}{\partial y}\left[\frac{h^3}{3Ca}\frac{\partial P}{\partial y}\right] = -EJ(x, y, t) \quad (3)$$

$$P = \left(\frac{\partial^2 h}{\partial x^2} + \frac{\partial^2 h}{\partial y^2}\right) \quad (4)$$

The droplet interface evolution equation may also be written in vector notation as in equation (5).

$$\frac{\partial h(\vec{\xi}, t)}{\partial t} + \nabla \cdot \left(\frac{h(\vec{\xi}, t)^3}{3Ca}\nabla \nabla^2 h(\vec{\xi}, t)\right) = -EJ(\vec{\xi}, t) \quad (5)$$

Equation (5) is partial differential equation with fourth order spatial derivative terms, and is nonlinear. Equation (5) has been written in vector notation in terms of a global position vector $\vec{\xi}$. The time dependence of the height of the droplet above a plane is a function of the evaporation rate and the divergence of a first vector. The first vector is a function of the gradient of the Laplacian of the height of the droplet above the plane. The magnitude of the first vector is also a function of the cube of the distance of the height of the droplet above a non-flat surface upon which the droplet rests. The magnitude of the first vector is also inversely related to the capillary number of the solution in the droplet.

The governing equations disclosed herein are to be solved over a region of interest Ω. In an embodiment of the present invention the region of interest Ω is limited to a space occupied by the droplet. The edge of the region of interest Ω may include a contact line ∂Ω'. In an embodiment of the invention the boundary condition along the contact line ∂Ω' may follow equation (6).

$$h = 0 \tag{6}$$

$$\frac{h^3}{3Ca}(\nabla \nabla^2 h) \cdot \hat{n} = 0$$

The unit vector n̂ used in equation (6) is a vector normal to the contact line ∂Ω'. In an embodiment of the invention the boundary condition along the symmetry plane x=0 may follow equation (7).

$$\frac{\partial h}{\partial x} = 0 \tag{7}$$

$$\frac{h^2}{3Ca}\frac{\partial}{\partial x}(\nabla^2 h) = 0$$

In an embodiment of the invention the boundary condition along the symmetry plane y=0 may follow equation (8).

$$\frac{\partial h}{\partial y} = 0 \tag{8}$$

$$\frac{h^2}{3Ca}\frac{\partial}{\partial y}(\nabla^2 h) = 0$$

Note that the evaporation rate $J(\vec{\xi},t)$ at the contact line ∂Ω is non-zero.

Solving high order nonlinear differential equations such as equation (5) can be very difficult. The presence of the contact line and the non-zero evaporation rate significantly increases the difficulty of solving equation (5). Prior art methods have not addressed solving non-linear lubrication equations that include evaporation and boundaries. Prior art methods have only addressed infinite films or films with periodic boundary conditions. The geometrical variation in three dimensions presents significant challenges for the finite difference approaches. In an embodiment of the present invention a finite element scheme is used solve this problem. Intermediate variable was once again introduced as in equation (9).

$$P(\vec{\xi},t) = \nabla^2 h(\vec{\xi},t) \tag{9}$$

Equation (5) may than be written in terms of intermediate variable P as in equation (10).

$$\frac{\partial h(\vec{\xi},t)}{\partial t} + \nabla \cdot \left(\frac{h(\vec{\xi},t)^3}{3Ca}\nabla P(\vec{\xi},t)\right) = -EJ(\vec{\xi},t) \tag{10}$$

Equation (10) describes the time dependence of the height of the droplet. The height of the droplet is measured relative to a single plane. In an embodiment of the present invention the single plane is below the substrate.

In an embodiment of the present invention two second order differential equations (9, 10) are solved instead of a single fourth-order differential equation (5). Because equation (5) is split into equation (9) and (10) we can utilize the boundary conditions (6)-(8) to obtain weak forms of equations (9) and (10) as described in equations (11) and (12). The weak forms of equations (9) an (10) are equations (11) and (12).

$$(P, \phi) = -(\nabla h, \nabla \phi) + \int_{\partial \Omega} \frac{\partial h}{\partial n}\phi dl \tag{11}$$

$$(P, \phi) = \int_\Omega P\phi d\Omega$$

$$(\nabla h, \nabla \phi) = \int_\Omega \nabla h \cdot \nabla \phi d\Omega$$

$$\left(\frac{\partial h}{\partial t}, \phi\right) - \left(\frac{h^3}{3Ca}\nabla P, \nabla \phi\right) = -(EJ, \phi) \tag{12}$$

$$\left(\frac{\partial h}{\partial t}, \phi\right) = \int_\Omega \frac{\partial h}{\partial t}\phi d\Omega$$

$$\left(\frac{h^3}{3Ca}\nabla P, \nabla \phi\right) = \int_\Omega \frac{h^3}{3Ca}\nabla P \cdot \nabla \phi d\Omega$$

$$(EJ, \phi) = \int_\Omega EJ\phi d\Omega$$

Where $$\frac{\partial h}{\partial n}$$

denotes the normal derivative of h on the boundary ∂Ω. The boundary ∂Ω may include the contact line ∂Ω', the xz-plane and the yz-plane.

Finite Element Numerical Scheme

To illustrate the algorithm, we look at the problem in a very simple two dimensional geometry. Suppose the problem solution domain is [0, 1]. At the center x=0. In an embodiment of the present invention, it may be assumed that that the derivate of the height at the center is zero. As described in equation (13).

$$\left.\frac{\partial h}{\partial x}\right|_{x=0} = 0 \tag{13}$$

At the contact point x=1, $$h|_{x=1} = 0, \left.\frac{h^3}{3Ca}\frac{\partial P}{\partial x}\right|_{x=1} = 0 \tag{14}$$

The droplet is sitting on a flat substrate. The weak forms of (9) and (10) may be written as equation (11) and (12). In which n is representative of an index along which the functions have been discretized in time t. As described in equation (16) the intermediate variable P is evaluated at a future time step n+1, while the other terms in the equation are evaluated at a current time step n. This is a semi-implicit formulation of a solution to the lubrication equation. The applicants have found that a semi-implicit formulation of the form shown in equation (16) has superior evaluation characteristics.

$$\int_0^1 P^n\phi dx = -\int_0^1 \frac{\partial h^n}{\partial x}\frac{\partial \phi}{\partial x}dx + \left.\frac{\partial h}{\partial x}\phi\right|_{x=1} \tag{15}$$

$$\int_0^1 \frac{h^{n+1} - h^n}{\Delta t} \phi \, dx = \int_0^1 \frac{h^3}{3Ca} \frac{\partial P^{n+1}}{\partial x} \frac{\partial \phi}{\partial x} dx - E \int_0^1 J^n \phi \, dx \quad (16)$$

The solution domain is composed of a set of L elements. Each element may contain a plurality of nodes. In an embodiment of the present invention the set of elements is a set of non-overlapping segments which are connected at the end points. Let both h and P have the same element l. Each element l has m nodes. The shape function at node j is $\Psi_j$. Thus, inside an element l each function h and P is described as weighted sum of a plurality of shape functions over each node in the element, l as described in equations (17)-(18). The temporal index n has been left out of some of the following equations in order to simplify the presentation of the equations.

$$h_l = \sum_i h_{l,i} \psi_{l,i} \quad (17)$$

$$P_l = \sum_i P_{l,i} \psi_{l,i} \quad (18)$$

Equation (15) written in terms of the shape functions $\Psi$ becomes equation (19).

$$\sum_i P_i \int_\Omega \psi_i \psi_j d\Omega = -\sum_i h_i \int_\Omega \frac{\partial \psi_i}{\partial x} \frac{\partial \psi_j}{\partial x} d\Omega + \sum_i h_i \frac{\partial \psi_i}{\partial x} \Big|_{x=1} \quad (19)$$

Equations (20) and (21) describe the integration of two shape functions and the derivatives of two shape functions in a one-dimensional element 1. $\Psi_{l,i}$ is a testing function that is used to describe the behavior of system variables and function over the element l at nodal point i.

$$(\psi_{l,i}, \psi_{l,j}) = \int_{x_l}^{x_{l+1}} \psi_{l,i}(x) \psi_{l,j}(x) dx \quad (20)$$

$$\left( \frac{\partial \psi_{l,i}}{\partial x}, \frac{\partial \psi_{l,j}}{\partial x} \right) = \int_{x_l}^{x_{l+1}} \frac{\partial \psi_{l,i}(x)}{\partial x} \frac{\partial \psi_{l,j}(x)}{\partial x} dx \quad (21)$$

To evaluate the integrals in (20) and (21), a Gaussian quadrature may be utilized in an embodiment of the present invention. An individual skilled in the art will appreciate that other evaluation techniques may be used with out going beyond the spirit and the scope of the invention. Equations (22) and (23) described the evaluation of the integrals (20) and (21) at a number of points, identified with the index k in the element l.

$$(\psi_{l,i}, \psi_{l,j}) = \sum_k \omega_{l,k} \psi_{l,i}(x_{l,k}^n) \psi_{l,j}(x_{l,k}^n) \quad (22)$$

$$\left( \frac{\partial \psi_{l,i}}{\partial x}, \frac{\partial \psi_{l,j}}{\partial x} \right) = \sum_k \omega_{l,k} \frac{\partial \psi_{l,i}}{\partial x}(x_{l,k}^n) \frac{\partial \psi_{l,j}}{\partial x}(x_{l,k}^n) \quad (23)$$

Where $x_{l,k}^n$ is the Gaussian quadrature points k in interval $(x_l, x_{l+1})$ and $\omega_{l,k}$ is the weight, which is determined by the number of integration points per element.

For an element l, the matrix version of part of the problem may be written as equation (24)

$$M_l \vec{P}_l = N_l \vec{h}_l \quad (24)$$

In an embodiment of the present invention each element may be made up of three nodes. The matrices used to describe the relationship between P and h in the element l are described in equations (24)-(26).

$$M_l = \begin{pmatrix} \sum_k \omega_{l,k} \psi_1(x_{l,k}) \psi_1(x_{l,k}) & \sum_k \omega_{l,k} \psi_2(x_{l,k}) \psi_1(x_{l,k}) & \sum_k \omega_{l,k} \psi_3(x_{l,k}) \psi_1(x_{l,k}) \\ \sum_k \omega_{l,k} \psi_1(x_{l,k}) \psi_2(x_{l,k}) & \sum_k \omega_{l,k} \psi_2(x_k^l) \psi_2(x_k^l) & \sum_k \omega_{l,k} \psi_3(x_{l,k}) \psi_2(x_{l,k}) \\ \sum_k \omega_{l,k} \psi_1(x_{l,k}) \psi_3(x_{l,k}) & \sum_k \omega_{l,k} \psi_2(x_{l,k}) \psi_3(x_{l,k}) & \sum_k \omega_{l,k} \psi_3(x_{l,k}) \psi_3(x_{l,k}) \end{pmatrix} \quad (25)$$

$$N_l = \begin{pmatrix} \sum_k \omega_{l,k} \frac{\partial \psi_1}{\partial x}(x_{l,k}) \frac{\partial \psi_1}{\partial x}(x_{l,k}) & \sum_k \omega_{l,k} \frac{\partial \psi_2}{\partial x}(x_{l,k}) \frac{\partial \psi_1}{\partial x}(x_{l,k}) & \sum_k \omega_{l,k} \frac{\partial \psi_3}{\partial x}(x_{l,k}) \frac{\partial \psi_1}{\partial x}(x_{l,k}) \\ \sum_k \omega_{l,k} \frac{\partial \psi_1}{\partial x}(x_{l,k}) \frac{\partial \psi_2}{\partial x}(x_{l,k}) & \sum_k \omega_k \frac{\partial \psi_2}{\partial x}(x_{l,k}) \frac{\partial \psi_2}{\partial x}(x_{l,k}) & \sum_k \omega_{l,k} \frac{\partial \psi_3}{\partial x}(x_{l,k}) \frac{\partial \psi_2}{\partial x}(x_{l,k}) \\ \sum_k \omega_{l,k} \frac{\partial \psi_1}{\partial x}(x_{l,k}) \frac{\partial \psi_3}{\partial x}(x_{l,k}) & \sum_k \omega_k \frac{\partial \psi_2}{\partial x}(x_{l,k}) \frac{\partial \psi_3}{\partial x}(x_{l,k}) & \sum_k \omega_{l,k} \frac{\partial \psi_3}{\partial x}(x_{l,k}) \frac{\partial \psi_3}{\partial x}(x_{l,k}) \end{pmatrix} \quad (26)$$

The matrices $M_l$ and $N_l$ shown in equations (25) and (26) are examples of three node elements that result in 3×3 matrices. An individual skilled in the art will appreciate that the size of the matrices $M_l$ and $N_l$ is dependent upon the number of nodes in each element l. Combining these local matrices into a big matrix with global indices, we have a set of linear equations for $\vec{P}_l$ to solve. The matrices M and N are square matrices with dimensions of the number of nodes.

$$M\vec{P} = N\vec{h} \quad (27)$$

Equation (24) describes the discrete relationship between vectors $\vec{P}$ and $\vec{h}$. In an embodiment of the present invention the interface is described by at least a quadratic polynomial, and the number of nodes per element may be at least three so that an accurate solution for (15) is found.

The same formulation may be used to solve equation (16).

$$\sum_i h_i^{n+1}(\psi_i, \psi_j) = \sum_i h_i^n(\psi_i, \psi_j) + \quad (28)$$

$$\frac{\Delta t}{3Ca} \sum_i \left(\sum_k h_i^n \psi_k\right)^3 P_i^{n+1}\left(\frac{\partial \psi_i}{\partial x}, \frac{\partial \psi_j}{\partial x}\right) - \Delta t E \sum_i J_i^n(\psi_i, \psi_j)$$

Equation (29) is a matrix formulation of equation (28). Note that P has an index of n+1 as opposed to n for most of the other terms in the equation.

$$M\vec{h}^{n+1} = M\vec{h}^n + \frac{\Delta t}{3Ca}K\vec{P}^{n+1} - \Delta t E M \vec{J}^n \quad (29)$$

$$K = \frac{\Delta t}{3Ca} \sum_i \left(\left(\sum_k h_i^n \psi_k\right)^3 \left(\frac{\partial \psi_i}{\partial x}, \frac{\partial \psi_j}{\partial x}\right)\right)$$

Equations (24) and (29) may be combined to give us equation (30).

$$\left(M - \frac{\Delta t}{3Ca}KM^{-1}N\right)\vec{h}^{n+1} = M\vec{h}^n - \Delta t E M \vec{J}^n \quad (30)$$

An embodiment of the present invention may include solving linear system (30) to get the value of $\vec{h}^{n+1}$ at the next time step n+1. In an embodiment of present invention a computer-readable program may call a general linear system solver from IMSL library to obtain the solution of (30).

In an embodiment of the present invention equation (30) may be solved repeatedly in order to describe the evolution of the droplet profile over time.

An embodiment of the present invention may include a method for describing the evolution of the height of a droplet over a plurality of time steps. This method may include finding an implicit solution to the Laplacian of the height of the droplet. This method may also include explicitly calculating a cube of a function of the height of the droplet. This method may also include explicitly calculating the evaporation rate of the droplet.

NUMERICAL RESULTS

Figure 2:
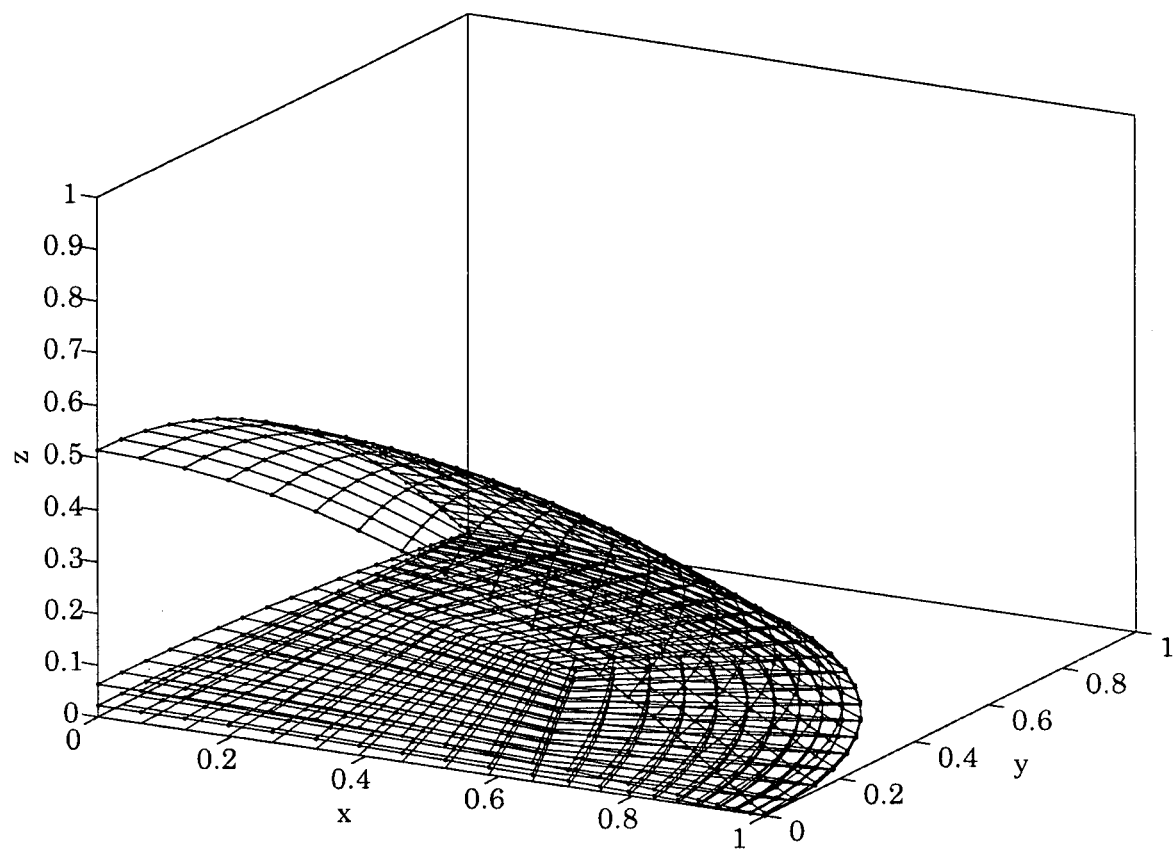
FIG. 2 is an illustration of the results of a simulation of a quadrant of a droplet evaporating on a substrate at several points in time.
Figure 3:
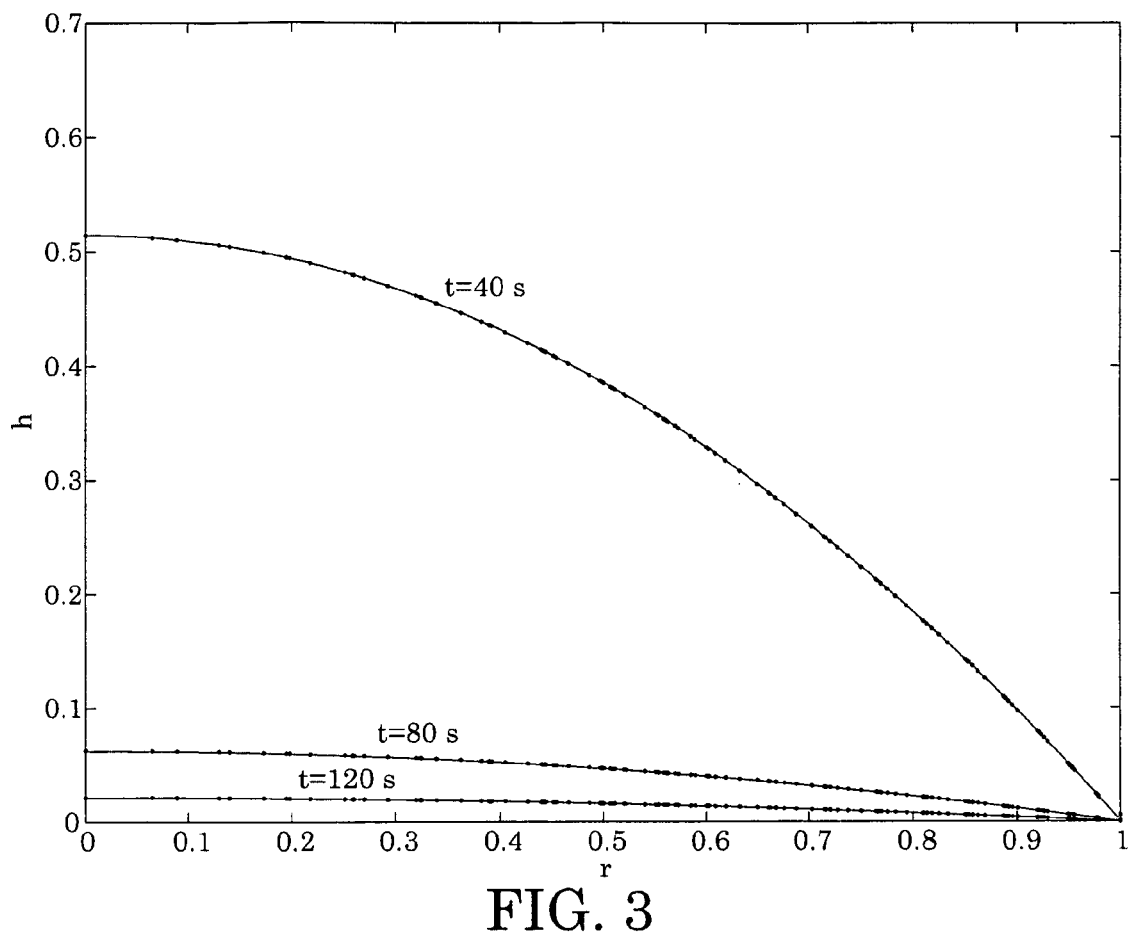
FIG. 3 is an illustration of radial profiles of the droplet at various times.

FIG. 2 is an illustration of the results of a simulation of a droplet evaporating on a substrate using the present invention. FIG. 2 is an illustration of a quadrant of a droplet at an initial time point and several subsequent times. FIG. 3 is an illustration of further results of the simulation of the droplet evaporating on a substrate using the present invention, showing radial profiles (h) of the droplet at various times.

Figure 4:
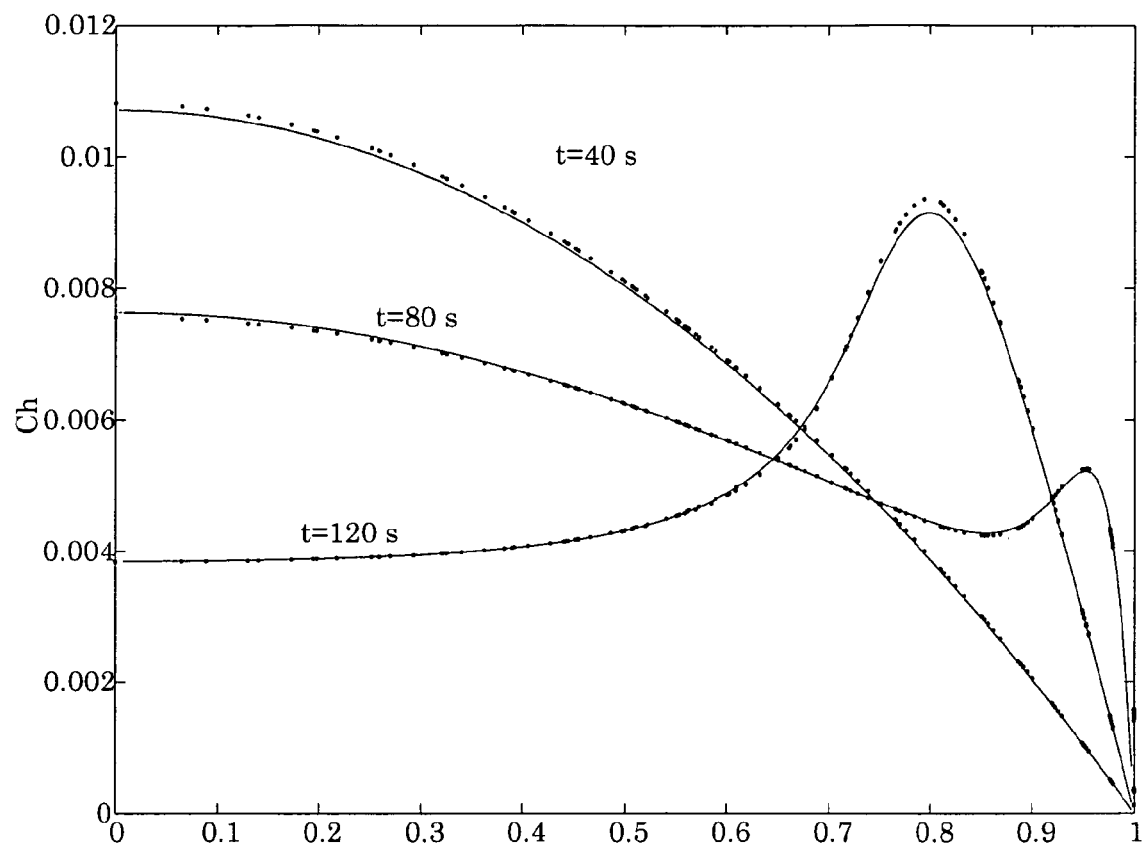
FIG. 4 is an illustration of a simulation parameter at various points in time as produced by an embodiment of the present invention.

FIG. 4 is an illustration of the simulation parameter (Ch), which is the product of the concentration (C) and the height (h), at various points in time as produced by an embodiment of the present invention.

The simulation used to produce FIGS. 2-4 used the following simulation parameters. The dimensionless diffusion coefficient is set at $1/Sc_0 = 0.01$. The droplet surface tension is $\sigma = 32 \times 10^{-3}$ N/m, the solvent viscosity is $\mu_0 = 3.5 \times 10^{-3}$ Pa·s and the capillary number is $Ca = 4.627 \times 10^{-7}$. In the illustrated example the viscosity does not vary over time. The initial droplet volume is 200 pl. The initial contact angle is 50 degrees. The evaporation rate of the solvent $J_0$ is $1 \times 10^{-7}$ m/s over the whole simulation period, and dimensionless evaporation parameter is E=0.5.

In this disclosure, we describe a finite element algorithm which is crucial in simulating the droplet shape and internal flows for an evaporating droplet in its final stage. A finite element algorithm has been proposed for a slender droplet evaporating with fixed contact line. A fourth-order nonlinear lubrication equation can be solved numerically. Comparing with the finite difference result, the finite element algorithm is accurate. The algorithm can be widely used to simulate droplet evaporation in either two dimensional or three dimensional geometries with complicated bank structures.

SYSTEM

Figure 5:
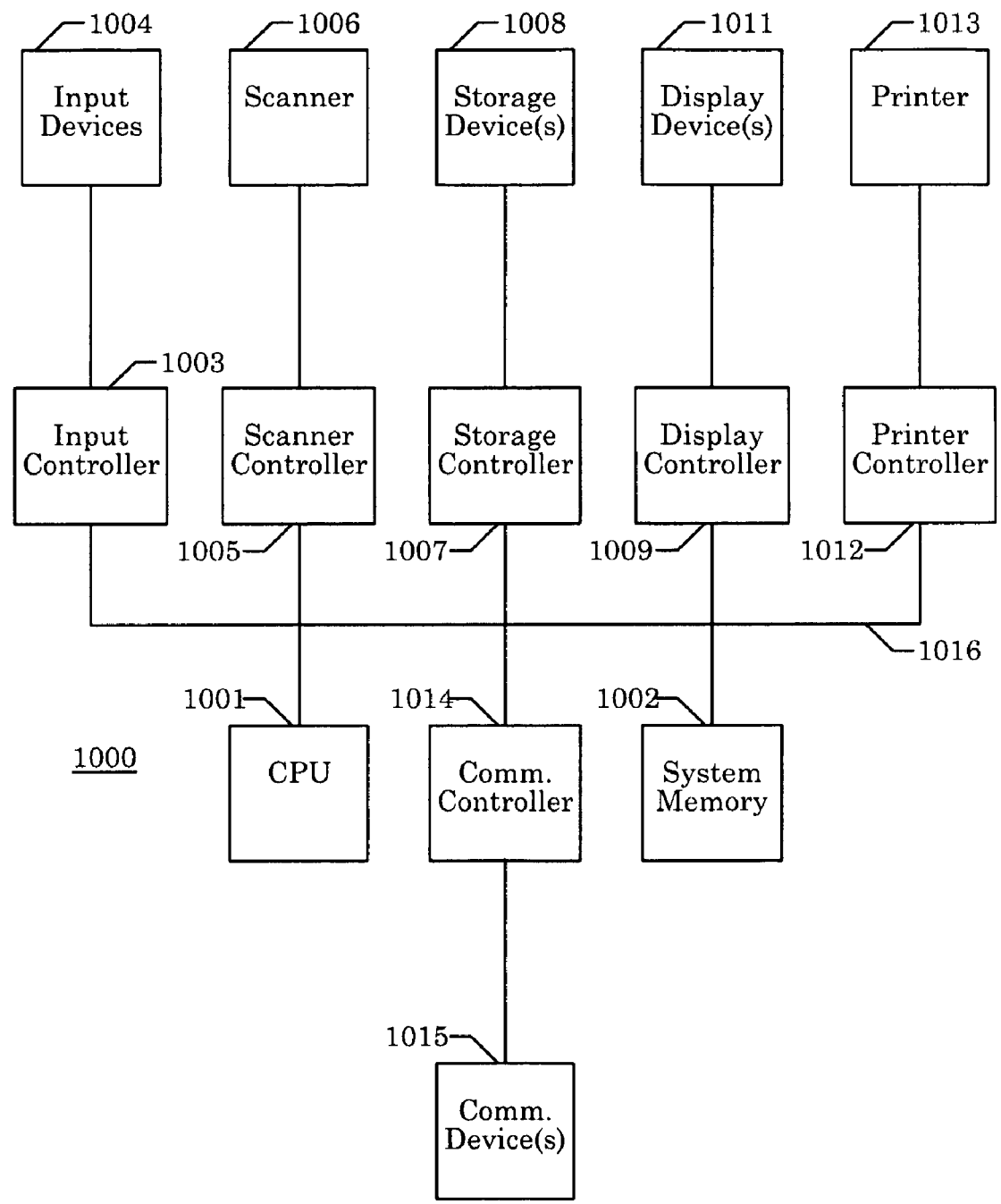
FIG. 5 is a simplified schematic diagram illustrating a system utilized to implement one or more aspects of the present invention

Having described the details of the invention, an exemplary system 1000, which may be used to implement one or more aspects of the present invention, will now be described with reference to FIG. 5. As illustrated in FIG. 5, the system includes a central processing unit (CPU) 1001 that provides computing resources and controls the computer. The CPU 1001 may be implemented with a microprocessor or the like, and may also include a graphics processor and/or a floating point coprocessor for mathematical computations. The system 1000 may also include system memory 1002, which may be in the form of random-access memory (RAM) and read-only memory (ROM).

A number of controllers and peripheral devices may also be provided, as shown in FIG. 5. An input controller 1003 represents an interface to various input device(s) 1004, such as a keyboard, mouse, or stylus. There may also be a scanner controller 1005, which communicates with a scanner 1006. The system 1000 may also include a storage controller 1007 for interfacing with one or more storage devices 1008 each of which includes a storage medium such as magnetic tape or disk, or an optical medium that might be used to record programs of instructions for operating systems, utilities and applications which may include embodiments of programs that implement various aspects of the present invention. Storage device(s) 1008 may also be used to store processed data or data to be processed in accordance with the invention. The system 1000 may also include a display controller 1009 for providing an interface to a display device 1011, which may be a cathode ray tube (CRT), or a thin film transistor (TFT) display. The system 1000 may also include a printer controller 1012 for communicating with a printer 1013. A communications controller 1014 may interface with one or more communication devices 1015 which enables the system 1000 to connect to remote devices through any of a variety of networks including the Internet, a local area network (LAN), a wide area network (WAN), or through any suitable electromagnetic carrier signals including infrared signals.

In the illustrated system, all major system components may connect to a bus 1016, which may represent more than one physical bus. However, various system components may or may not be in physical proximity to one another. For example, input data and/or output data may be remotely transmitted from one physical location to another. In addition, programs that implement various aspects of this invention may be accessed from a remote location (e.g., a server) over a network. Such data and/or programs may be conveyed through any of a variety of machine-readable medium including magnetic tape or disk or optical disc, or a transmitter, receiver pair.

The present invention may be conveniently implemented with software. However, alternative implementations are certainly possible, including a hardware implementation or a software/hardware implementation. Any hardware-implemented functions may be realized using ASIC(s), digital signal processing circuitry, or the like. Accordingly, the "means"

terms in the claims are intended to cover both software and hardware implementations. Similarly, the term "computer-readable medium" as used herein includes software and or hardware having a program of instructions embodied thereon, or a combination thereof. With these implementation alternatives in mind, it is to be understood that the figures and accompanying description provide the functional information one skilled in the art would require to write program code (i.e., software) or to fabricate circuits (i.e., hardware) to perform the processing required.

In accordance with further aspects of the invention, any of the above-described methods or steps thereof may be embodied in a program of instructions (e.g., software), which may be stored on, or conveyed to, a computer or other processor-controlled device for execution on a computer readable medium. Alternatively, any of the methods or steps thereof may be implemented using functionally equivalent hardware (e.g., application specific integrated circuit (ASIC), digital signal processing circuitry, etc.) or a combination of software and hardware.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the appended claims.

What is claimed is:

1. A non-transitory computer-readable medium encoded with instructions for a processor to perform a method for simulating the evolution of a height of an evaporating droplet comprising:

generating a simulation space, wherein the simulation space is described in terms of three axes, a x-axis, a y-axis, and a z-axis, the three axes are orthogonal to each other; the simulation space is bounded by a xz-plane defined by the x-axis and the z-axis; the simulation space is also bounded by a yz-plane defined by the y-axis and the z-axis;

generating a height function that is representative of the height of the droplet at a first point in time at a plurality of points in the simulation space based upon a lubrication equation that is a differential function describing variation of the height function over time; and determining the height function at a second point in time by finding an approximate solution that satisfies the lubrication equations and boundary conditions, the boundary conditions along the xz-plane includes equating to zero a function of a partial derivate along the y-axis of a Laplacian of the height function, the boundary conditions along the xz-plane further includes equating to zero the partial derivative of the height function along the y-axis; the boundary conditions along the yz-plane includes equating to zero a function of a partial derivate along the x-axis of a Laplacian of the height function, the boundary conditions along the yz-plane further includes equating to zero the partial derivate of the height function along the x-axis.

2. The non-transitory computer-readable medium of claim 1 wherein the lubrication equation includes:

a first differential function that describes a proportional relationship between an intermediate variable and a Laplacian of the height function;

a second differential function that comprises:

a first term that is a partial derivative of the height function with respect to time;

a second term that is proportional to the evaporation rate of the droplet; and a third term that is a third function of the height function, and the intermediate variable.

3. The non-transitory computer-readable medium of claim 2, wherein the third function is a divergence of a fourth function of the height and the intermediate variable.

4. The non-transitory computer-readable medium of claim 3, wherein the fourth function is proportional to the cube of the height function.

5. The non-transitory computer-readable medium of claim 3, wherein the fourth function is proportional to the gradient of the intermediate variable.

6. The non-transitory computer-readable medium of claim 1, wherein the approximate solution is found using the finite element method.

7. The non-transitory computer-readable medium of claim 1, wherein the evaporation rate of the droplet is a function of space and time.

8. The non-transitory computer-readable medium of claim 2, wherein the first differential function is described by the equation, $P(\vec{\xi},t)=\nabla^2 h(\vec{\xi},t)$, wherein P is the intermediate variable, h is the height function.

9. The non-transitory computer-readable medium of claim 2, wherein the second differential function is described by the equation, $$\frac{\partial h(\vec{\xi}, t)}{\partial t} + \nabla \cdot \left( \frac{h(\vec{\xi}, t)^3}{3Ca} \nabla P(\vec{\xi}, t) \right) = -EJ(\vec{\xi}, t),$$

wherein P is the intermediate variable, h is the height function, $\vec{\xi}$ is a position vector, Ca is the Capillary Number, E is the dimensionless evaporation parameter, and J is the evaporation rate.

10. A system including the non-transitory computer-readable medium and processor of claim 1, for performing the instructions recited in claim 1.

11. The non-transitory computer-readable medium of claim 2, wherein the first differential function is solved implicitly, the second term of the second differential function is solved explicitly, and the height portion of the third function is solved explicitly.

12. A method of manufacturing that includes evaporating droplets on a substrate, wherein the manufacturing method is adjusted based on the results of operation of the method of claim 1 encoded on the non-transitory computer readable medium.

13. A non-transitory computer-readable medium encoded with instructions for a processor to perform a method for simulating the evolution of a height of an evaporating droplet comprising:

generating a simulation space;

generating a height function that is representative of the height of the droplet at a first point in time at a plurality of points in the simulation space based upon a lubrication equation that is a differential function describing variation of the height function over time; and determining the height function at a second point in time by finding an approximate solution that satisfies the lubrication equations and boundary conditions that includes a contact line.

14. A method of manufacturing that includes evaporating droplets on a substrate, wherein the manufacturing method is adjusted based on the results of operation of the method of claim 13 encoded on the non-transitory computer readable medium.

15. The non-transitory computer readable medium of claim 2, wherein the boundary conditions includes equating to zero a first function that includes a dot product of a vector normal to the contact line with a second function, in which the second function is a gradient of a Laplacian of the height function.

* * * * *